(12) United States Patent
Rwei et al.

(10) Patent No.: US 11,546,997 B2
(45) Date of Patent: *Jan. 3, 2023

(54) TWISTABLE ELECTRONIC DEVICE MODULE

(71) Applicant: National Taipei University of Technology, Taipei (TW)

(72) Inventors: Syang-Peng Rwei, Taipei (TW); Tzu-Wei Chou, Taipei (TW); Sheng-Yuan Huang, Taipei (TW)

(73) Assignee: National Taipei University of Technology, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/377,398

(22) Filed: Jul. 16, 2021

(65) Prior Publication Data

US 2022/0386469 A1    Dec. 1, 2022

(30) Foreign Application Priority Data

Jun. 1, 2021   (TW) .................................. 110119902

(51) Int. Cl.
  *H05K 1/18*       (2006.01)
  *H01L 23/498*     (2006.01)
  (Continued)

(52) U.S. Cl.
  CPC ......... *H05K 1/189* (2013.01); *H01L 23/4985* (2013.01); *H01L 23/49811* (2013.01);
  (Continued)

(58) Field of Classification Search
  CPC .. H05K 1/189; H05K 1/118; H01L 23/49811; H01L 23/4985; H01L 25/0655
  (Continued)

(56) References Cited

U.S. PATENT DOCUMENTS 7,980,863 B1 *   7/2011  Holec ................... H05K 3/363
                                                      439/67
2015/0377466 A1  12/2015  Gershowitz et al.
(Continued)

FOREIGN PATENT DOCUMENTS

| CN | 106879190 | 6/2017 |
| TW | I682532 | 1/2020 |
| TW | 202107951 | 2/2021 |

OTHER PUBLICATIONS

"Office Action of Taiwan Counterpart Application", dated Feb. 15, 2022, p. 1-p. 5.

*Primary Examiner* — Andargie M Aychillhum
(74) *Attorney, Agent, or Firm* — JCIPRNET

(57) ABSTRACT

A twistable electronic device module including a twistable substrate, an electrode pattern layer, an insulating layer, a circuit layer, a plurality of circuit boards and a plurality of electronic devices is provided. The electrode pattern layer is disposed on the twistable substrate. The insulating layer is disposed on the electrode pattern layer. The edge of the insulating layer has an opening located at the edge of the twistable substrate and exposing a part of the electrode pattern layer. The circuit layer is disposed on the insulating layer and on the sidewall of the opening, and is connected with the electrode pattern layer. The plurality of circuit boards are disposed on the circuit layer, and each is electrically connected to the circuit layer. The plurality of electronic devices are disposed on the plurality of circuit boards, and each is electrically connected to a corresponding one of the plurality of circuit boards.

10 Claims, 4 Drawing Sheets

(51) Int. Cl.
- *H01L 25/065* (2006.01)
- *H01L 25/18* (2006.01)
- *H05K 1/11* (2006.01)
- *H01L 23/00* (2006.01)

(52) U.S. Cl.
CPC .......... *H01L 25/0655* (2013.01); *H01L 25/18* (2013.01); *H05K 1/118* (2013.01); *H01L 24/16* (2013.01); *H01L 2224/16225* (2013.01); *H05K 2201/049* (2013.01); *H05K 2201/09281* (2013.01); *H05K 2201/09754* (2013.01); *H05K 2201/10378* (2013.01); *H05K 2201/10522* (2013.01)

(58) Field of Classification Search
USPC .......................................................... 361/749
See application file for complete search history.

(56) References Cited

U.S. PATENT DOCUMENTS

| | | | |
|---|---|---|---|
| 2016/0105950 A1* | 4/2016 | Drzaic | ................. H05K 3/0014 156/196 |
| 2021/0067669 A1 | 3/2021 | Park | |

\* cited by examiner

TWISTABLE ELECTRONIC DEVICE MODULE

CROSS-REFERENCE TO RELATED APPLICATION

This application claims the priority benefit of Taiwan application serial no. 110119902, filed on Jun. 1, 2021. The entirety of the above-mentioned patent application is hereby incorporated by reference herein and made a part of this specification.

BACKGROUND

Technical Field

The disclosure relates to an electronic device module, and particularly relates to a twistable electronic device module.

Description of Related Art

In recent years, the technology related to smart fabrics has been adopted as solutions by garment manufacturers and clothing designers to solve their technical problems in industry, essentials services, leisure, and medical care, and therefore such technology conforms to the trend of wearable electronic devices.

For conventional wearable electronic devices, multiple electronic devices are arranged on a substrate and are electrically connected to the circuit layer that drives these electronic devices. In order to drive these electronic devices, multiple circuit layers are required to be provided in the electronic device, and conductive vias have to be provided between these circuit layers. As a result, circuit design is difficult, and the electronic device is likely to be broken due to bending.

SUMMARY

The disclosure provides a twistable electronic device module, which includes an electronic device and a circuit board arranged between the electronic device and a circuit layer.

A twistable electronic device module of the disclosure includes a twistable substrate, an electrode pattern layer, an insulating layer, a circuit layer, a plurality of circuit boards and a plurality of electronic devices. The electrode pattern layer is disposed on the twistable substrate. The insulating layer is disposed on the electrode pattern layer. The edge of the insulating layer has an opening located at the edge of the twistable substrate and exposing a part of the electrode pattern layer. The circuit layer is disposed on the insulating layer and on the sidewall of the opening, and is connected with the electrode pattern layer. The plurality of circuit boards are disposed on the circuit layer, and each of the circuit boards is electrically connected to the circuit layer. The plurality of electronic devices are disposed on the plurality of circuit boards, and each of the electronic devices is electrically connected to a corresponding one of the plurality of circuit boards.

In an embodiment of the twistable electronic device module of the disclosure, the thickness of the circuit board is between 35 μm and 180 μm.

In an embodiment of the twistable electronic device module of the disclosure, the distance between the edge of the electronic device disposed on the circuit board and the edge of the circuit board does not exceed 20% of the width of the circuit board.

In an embodiment of the twistable electronic device module of the disclosure, the edge of the electronic device disposed on the circuit board is aligned with the edge of the circuit board.

In an embodiment of the twistable electronic device module of the disclosure, the edge of the electronic device disposed on the circuit board does not exceed the edge of the circuit board.

In an embodiment of the twistable electronic device module of the disclosure, the electronic device includes a chip having active devices, passive devices, or a combination thereof.

In an embodiment of the twistable electronic device module of the disclosure, the twistable electronic device module further includes a controller and a connecting device connecting the controller and the exposed portion of the electrode pattern layer.

In an embodiment of the twistable electronic device module of the disclosure, the connecting device includes a wire, a conductive fiber, a conductive fabric, a low temperature solder, a conductive metal adhesive, a liquid metal package, or a combination thereof.

In an embodiment of the twistable electronic device module of the disclosure, the twistable electronic device module further includes a protective layer covering the interface between the connecting device and the electrode pattern layer.

In an embodiment of the twistable electronic device module of the disclosure, the twistable electronic device module further includes a protective layer disposed on the insulating layer and covering the circuit layer, the plurality of circuit boards, and the plurality of electronic devices, and the protective layer exposes the electrode pattern layer in the opening.

Based on the above, in the twistable electronic device module of the disclosure, the circuit board is disposed between the electronic device and the circuit layer, so that it is possible to effectively avoid the bumps or the like used to connect the electronic device and the circuit layer from causing damage to the circuit layer.

In order to make the above-mentioned features and advantages of the present disclosure more comprehensible, the following specific embodiments are described in detail in conjunction with the accompanying drawings.

DESCRIPTION OF THE EMBODIMENTS

The following examples are provided with reference to the drawings for detailed description, but the provided examples are not used to limit the scope of the disclosure. In addition, the drawings are for illustrative purposes only, and are not drawn in accordance with the original dimensions. In order to facilitate understanding, the same elements will be described with the same symbols in the following description.

The terms "include", "comprise", "have" and so on used in the text are all open terms, which means "including but not limited to".

In addition, the directional terms mentioned in the text, such as "up", "down", etc., are only used to refer to the direction of the drawings, and are not used to limit the present disclosure. Therefore, it should be noted that "on" can be used interchangeably with "under", and when an element such as a layer or film is placed "on" another element, the element can be directly placed on the other element, or there may be an intermediate element disposed therebetween. On the other hand, when an element is described as being placed "directly" on another element, there is no intermediate element between the two.

In the following embodiments, the numbers and shapes mentioned are only used to specifically illustrate the present disclosure in order to facilitate understanding, but not to limit the present disclosure.

Figure 1A:
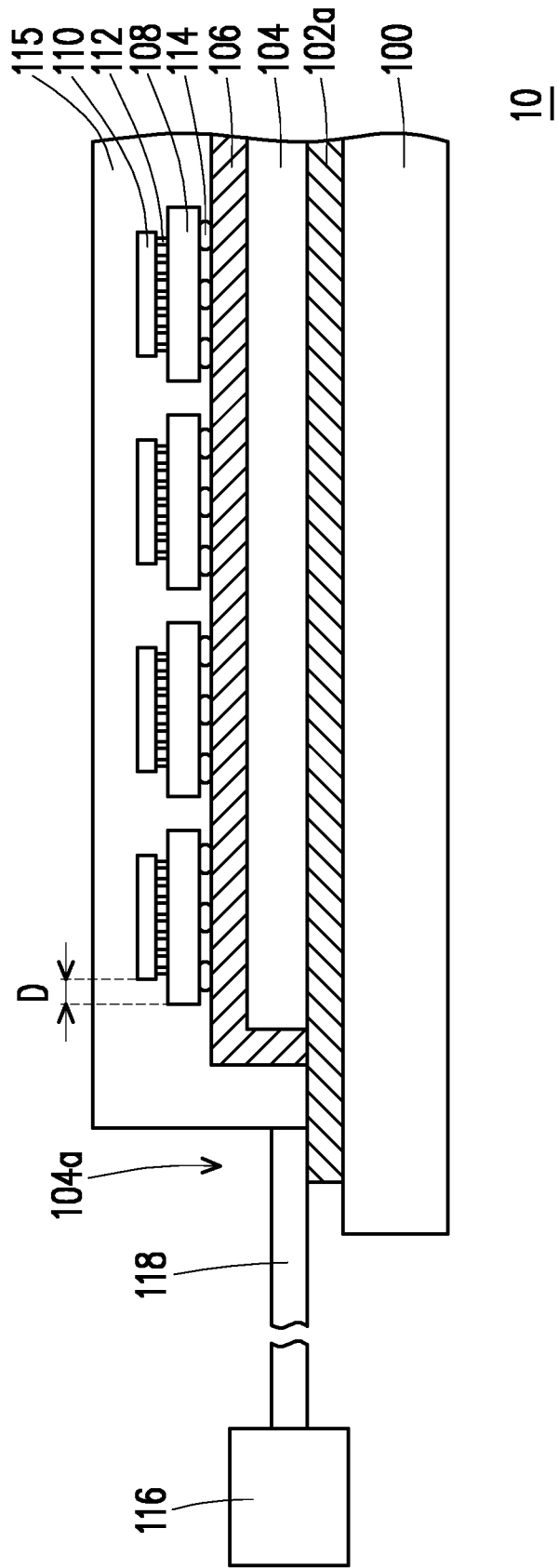
FIG. 1A is a schematic cross-sectional view of a twistable electronic device module according to a first embodiment of the disclosure.
Figure 1B:
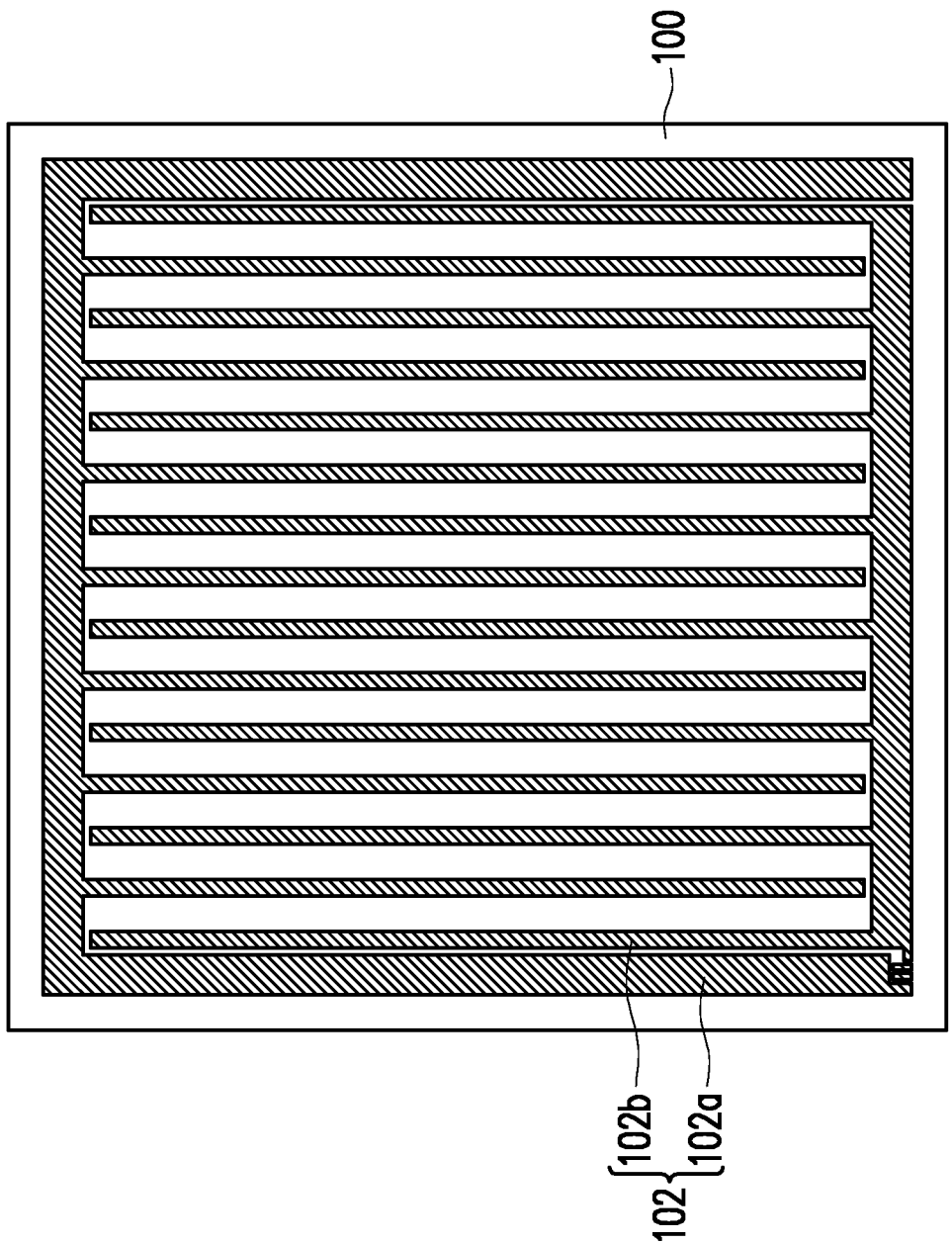
FIG. 1B is a schematic top view of the electrode pattern layer in the twistable electronic device module according to the first embodiment of the disclosure.
Figure 1C:
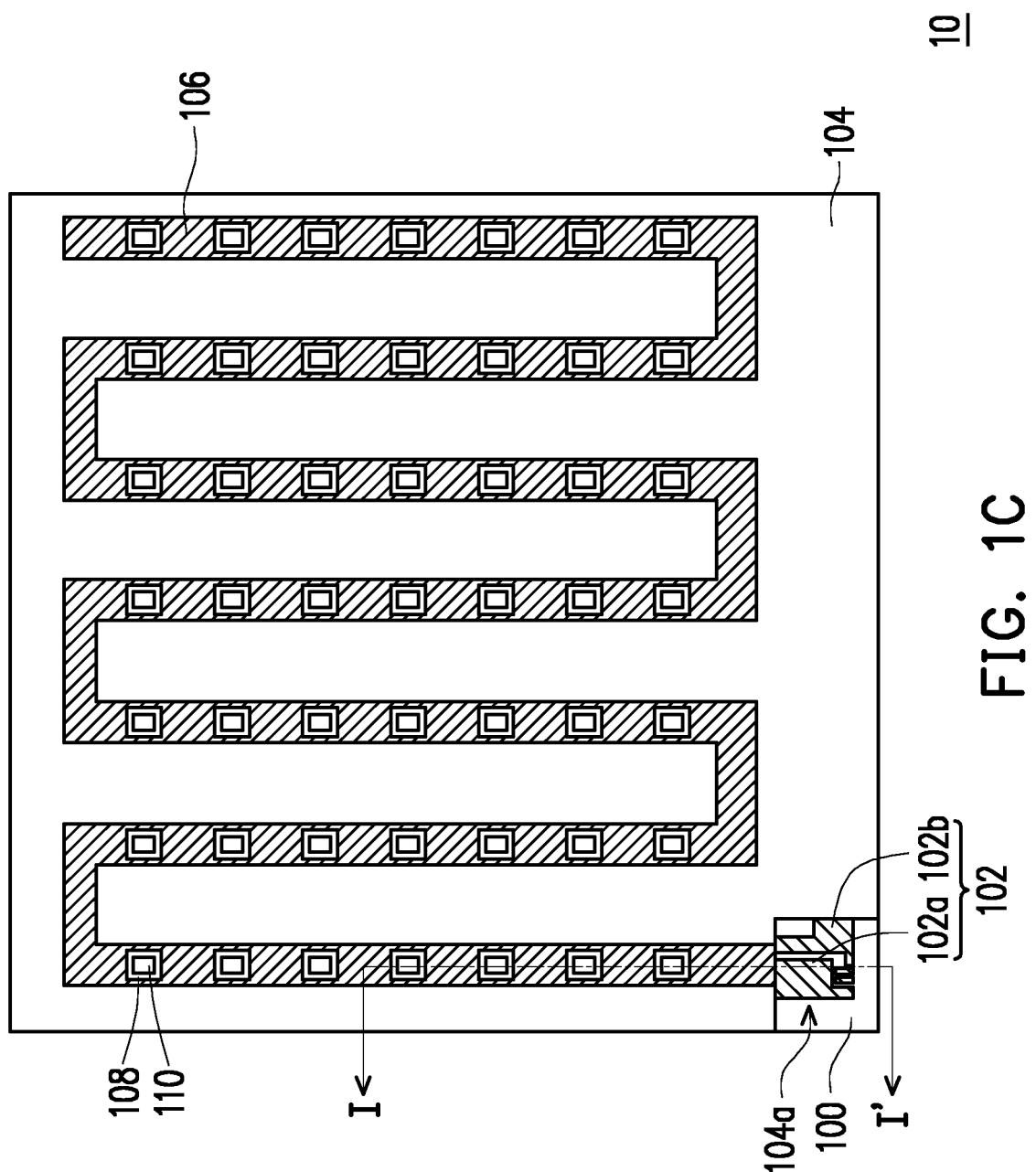
FIG. 1C is a schematic top view of a twistable electronic device module according to the first embodiment of the disclosure.

FIG. 1A is a schematic cross-sectional view of a twistable electronic device module according to a first embodiment of the disclosure. FIG. 1B is a schematic top view of the electrode pattern layer in the twistable electronic device module according to the first embodiment of the disclosure. FIG. 1C is a schematic top view of a twistable electronic device module according to the first embodiment of the disclosure. FIG. 1A is drawn along the sectional line I-I' in FIG. 1C, and for clarity, the protective layer, the controller, and the connecting device are omitted in FIG. 1C.

Please refer to FIG. 1A, FIG. 1B, and FIG. 1C at the same time. The twistable electronic device module 10 of this embodiment includes a twistable substrate 100, an electrode pattern layer 102, an insulating layer 104, a circuit layer 106, a plurality of circuit boards 108, and a plurality of electronic devices 110. The twistable substrate 100 is characterized in being bendable, twistable, and foldable. In this embodiment, the twistable substrate 100 may be a polyurethane (PU) substrate, a silicone substrate, a rubber substrate, or other suitable substrates.

The electrode pattern layer 102 is disposed on the twistable substrate 100. In this embodiment, the electrode pattern layer 102 constitutes a finger electrode, which includes an electrode 102a and an electrode 102b, as shown in FIG. 1B. The electrode 102a and the electrode 102b can serve as a positive electrode and a negative electrode, respectively. The electrode 102a and the electrode 102b each have a body portion and a finger portion extending from the body portion, and the finger portion of the electrode 102a and the finger portion of the electrode 102b are alternately arranged. However, the disclosure is not limited thereto. In other embodiments, the electrode pattern layer 102 may form various patterns according to actual requirements. The material of the electrode pattern layer 102 can be any suitable conductive material, and can be formed on the twistable substrate 100 by any suitable method (such as spraying, screen printing, roll-to-roll printing, 3D printing, plating, sputtering etc.).

The insulating layer 104 is disposed on the electrode pattern layer 102. The edge of the insulating layer 104 has an opening 104a. The opening 104a is located at the edge of the twistable substrate 100 and exposes a part of the electrode pattern layer 102. In this embodiment, the corner of the insulating layer 104 (the lower left corner in FIG. 1C) has an opening 104a, and the opening 104a is located at the corner of the twistable substrate 100 (the lower left corner in FIG. 1C), and exposes a part of the electrode 102a and a part of the electrode 102b. The exposed part of the electrode 102a and the exposed part of the electrode 102b can serve as contacts for connecting to an external device. In other embodiments, the opening 104a may not be located at the corner, as long as the position of the required contact can be exposed for easy connection. The material of the insulating layer 104 can be any suitable insulating material, and can be formed on the twistable substrate 100 by any suitable method (such as spraying, screen printing, roll-to-roll printing, 3D printing, etc.) to cover the electrode pattern layer 102.

The circuit layer 106 is disposed on the insulating layer 104. Moreover, the circuit layer 106 is disposed on the sidewall of the opening 104a to extend along the sidewall of the opening 104a to the bottom of the opening 104a to be connected to the electrode pattern layer 102. In this way, when the contact exposed by the opening 104a is connected to an external device, the electronic device electrically connected to the circuit layer 106 can be activated through the voltage supplied by the external device. Moreover, the circuit layer 106 can be used to electrically connect multiple electronic devices that are electrically connected thereto. The layout of the circuit layer 106 is not limited to that shown in FIG. 1C. In other embodiments, the layout of the circuit layer 106 can be adjusted according to actual needs. The material of the circuit layer 106 can be any suitable conductive material, and can be formed on the insulating layer 104 by any suitable method (such as spraying, screen printing, roll-to-roll printing, 3D printing, etc.).

The electronic device 110 is disposed on the circuit layer 106, and is electrically connected to the circuit layer 106, respectively. The electronic device 110 can be a chip having active devices or passive devices. The active device or passive device is, for example, transistors, memory, diodes, resistors, capacitors, inductors, microcontroller units (MCU), sensors, etc. Furthermore, a circuit board 108 is provided between the electronic device 110 and the circuit layer 106. In this embodiment, a circuit board 108 is disposed between an electronic device 110 and the circuit layer 106, but the disclosure is not limited thereto. In other embodiments, a plurality of electronic devices 110 can be arranged on one circuit board 108 according to actual conditions.

In this embodiment, the electronic device 110 is disposed in the central area of the circuit board 108, and the distance D between the edge of the electronic device 110 and the edge of the circuit board 108 does not exceed 20% of the width of the circuit board 108. In another embodiment, the edge of the electronic device 110 can be aligned with the edge of the circuit board 108, that is, the distance D is zero. In other words, the distance D between the edge of the electronic device 110 and the edge of the circuit board 108 does not exceed 20% of the width of the circuit board 108, and the edge of the electronic device 110 does not exceed the edge of the circuit board 108. Specifically, in the case where a plurality of electronic devices 110 are arranged on one circuit board 108, when the distance D between the edge of each electronic device 110 and the edge of the circuit board 108 exceeds 20% of the width of the circuit board 108, the electronic devices 110 are too close to each other and thus the problem of short circuit will arise. In addition, when the edge of the electronic device 110 goes beyond the edge of the circuit board 108, in the condition that the electronic device module 10 is bent, the portion of the electronic device 110 that extends beyond the edge of the circuit board 108 will cause damage or even breakage to the underlying layer (for example, the circuit layer 106), resulting in open circuit problems.

In addition, in this embodiment, the circuit board 108 is disposed between the electronic device 110 and the circuit layer 106, which can effectively prevent the bumps or the like connecting the electronic device 110 and the circuit layer 106 from damaging the circuit layer 106. Generally speaking, the surface of the electronic device 110 is provided with a plurality of pads for electrically connecting to external devices, and these pads are usually densely arranged, and therefore the bumps or the like must be designed with a small size. When these bumps or the like physically contact the circuit layer 106, it is likely to cause scratch to the circuit layer 106 and affect the electrical properties of the circuit layer 106. Therefore, in this embodiment, the electronic device 110 is electrically connected to the circuit board 108 through the bump 112 or the like, and the circuit board 108 is electrically connected to the circuit layer 106 through the bump 114 or the like. Since a less number of pads may be provided between the circuit board 108 and the circuit layer 106, the bump 114 or the like can have a larger size and can be provided less in quantity, thus effectively preventing the circuit layer 106 from being damaged.

Moreover, in this embodiment, the thickness of the circuit board 108 is, for example, between 35 μm and 180 μm. When the thickness of the circuit board 108 is greater than 180 μm, the hardness of the circuit board 108 is too high, causing the problem that the circuit board 108 cannot be twisted. When the thickness of the circuit board 108 is less than 35 μm, the thickness of the circuit board 108 is too thin, and the circuit board 108 is likely to be broken when being twisted. When the thickness of the circuit board 108 is between 35 μm and 180 μm, the bending angle can be up to 150° or more, so that the twistable electronic device module 10 of this embodiment is suitable for twisting.

In this embodiment, the electronic device module 10 may further include a protective layer 115 disposed on the insulating layer 104. The protective layer 115 covers the circuit layer 106, the circuit board 108 and the electronic device 110, and exposes the electrode pattern layer 102 in the opening 104. The material of the protective layer 115 is, for example, a material characterized in waterproof, thermal conductivity, and moisture impermeability, and can be formed on the insulating layer 104 by any suitable method (such as dispensing, spraying, screen printing, roll-to-roll printing, 3D printing, etc.).

In this embodiment, the electronic device module 10 may further include a controller 116 and a connecting device 118 connecting the controller 116 and the exposed portion (i.e., contact) of the electrode pattern layer 102. The controller 116 may include various electronic devices (such as batteries, wireless receivers, wireless fidelity (WIFI) receivers, bluetooth receivers, infrared receivers, display panels, etc.) according to actual needs, the disclosure provides no limitation thereto. As described above, the controller 116 can provide voltage to control the electronic device 110. The connecting device 118 may be any type of connecting device, as long as it can electrically connect the controller 116 to the exposed portion of the electrode pattern layer 102. For example, the connecting device 118 may be a wire (such as a copper wire, a gold wire, etc.), a conductive fiber, a conductive fabric, a low temperature solder, a conductive metal adhesive, a liquid metal package, or a combination thereof.

In this embodiment, the insulating layer 104 only needs to have an opening 104a to expose the contact connected to the external device. Therefore, the electrode pattern layer 102 disposed on the twistable substrate 100 can be effectively protected by the insulating layer 104 and not easily damaged. In addition, since the opening 104a is located at the edge of the insulating layer 104 and exposes the contact located at the edge of the twistable substrate 100, the external device can be easily connected to the contact. Moreover, in other embodiments, the edge of the insulating layer 104 may have other openings to expose the contact for connecting with another electronic device module. In this way, a large area for application can be achieved by electrically connecting multiple electronic device modules.

Figure 2:
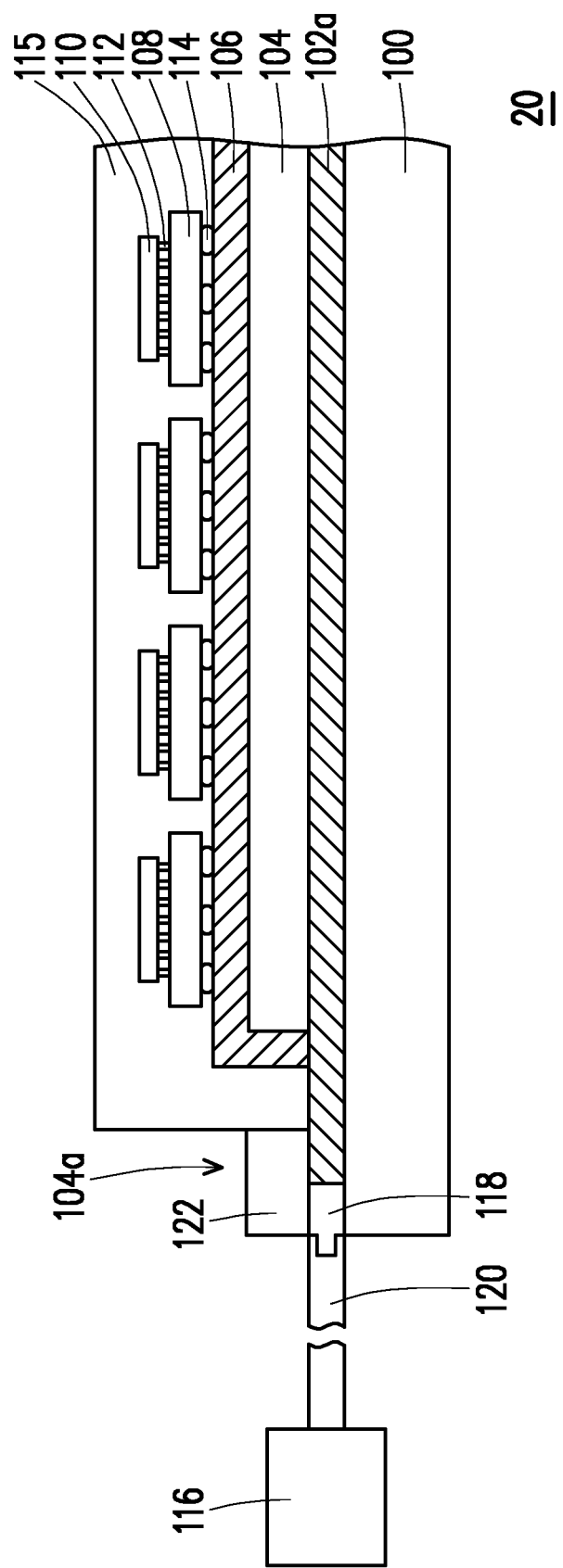
FIG. 2 is a schematic cross-sectional view of a twistable electronic device module according to a second embodiment of the disclosure.

FIG. 2 is a schematic cross-sectional view of a twistable electronic device module according to a second embodiment of the disclosure. In this embodiment, the same elements used in the first embodiment will be denoted by the same reference symbols, and related description will be omitted.

Referring to FIG. 2, in the electronic device module 20, the connecting device 118 may be a male connecting device connected to the exposed portion (i.e., contact) of the electrode pattern layer 102, and the connecting device 118 may be electrically connected to the controller 116 through a wire 120 having a female connector. In other embodiments, the connecting device 118 may be a female connecting device, and the connecting device 118 may be electrically connected to the controller 116 through a wire 120 having a male connector. Furthermore, the protective layer 122 can cover the interface between the connecting device 118 and the electrode pattern layer 102 to ensure electrical connection between the connecting device 118 and the electrode pattern layer 102. The material of the protective layer 122 is, for example, a material characterized in waterproof, thermal conductivity, and moisture impermeability, and can be formed by any suitable method (such as dispensing, spraying, etc.).

Although the present disclosure has been disclosed in the above embodiments, it is not intended to limit the present disclosure, and those skilled in the art can make some modifications and refinements without departing from the spirit and scope of the disclosure. Therefore, the scope of the present disclosure is subject to the definition of the scope of the appended claims.

What is claimed is:

1. A twistable electronic device module, comprising:
   a twistable substrate;
   an electrode pattern layer, disposed on the twistable substrate;
   an insulating layer, disposed on the electrode pattern layer, wherein an edge of the insulating layer has an opening, and the opening is located at an edge of the twistable substrate and exposes a portion of the electrode pattern layer;
   a circuit layer, disposed on the insulating layer and on a sidewall of the opening, and connected to the electrode pattern layer;
   a plurality of circuit boards, disposed on the circuit layer and each of the plurality of circuit boards being electrically connected to the circuit layer; and
   a plurality of electronic devices, disposed on the plurality of circuit boards, and each of the plurality of electronic devices being electrically connected to a corresponding one of the plurality of circuit boards.

2. The twistable electronic device module according to claim 1, wherein a thickness of the circuit board is between 35 μm and 180 μm.

3. The twistable electronic device module according to claim 1, wherein a distance between an edge of the electronic device disposed on the circuit board and an edge of the circuit board does not exceed 20% of a width of the circuit board.

4. The twistable electronic device module according to claim 3, wherein the edge of the electronic device disposed on the circuit board is aligned with the edge of the circuit board.

5. The twistable electronic device module according to claim 1, wherein an edge of the electronic device disposed on the circuit board does not exceed an edge of the circuit board.

6. The twistable electronic device module according to claim 1, wherein the electronic device comprises a chip having active devices, passive devices, or a combination thereof.

7. The twistable electronic device module according to claim 1, further comprising:
a controller; and
a connecting device, connecting the controller and the exposed portion of the electrode pattern layer.

8. The twistable electronic device module according to claim 7, wherein the connecting device comprises a wire, a conductive fiber, a conductive fabric, a low temperature solder, a conductive metal adhesive, a liquid metal package, or a combination thereof.

9. The twistable electronic device module according to claim 7, further comprising a protective layer covering a region where the connecting device and the electrode pattern layer are connected.

10. The twistable electronic device module according to claim 1, further comprising a protective layer disposed on the insulating layer and covering the circuit layer, the plurality of circuit boards, and the plurality of electronic devices, and exposing the opening.

* * * * *